(12) United States Patent
Gidon et al.

(10) Patent No.: US 8,735,953 B2
(45) Date of Patent: May 27, 2014

(54) LIGHT REFLECTING CMOS IMAGE SENSOR

(75) Inventors: Pierre Gidon, Echirolles (FR); Yvon Cazaux, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 769 days.

(21) Appl. No.: 12/551,715

(22) Filed: Sep. 1, 2009

(65) Prior Publication Data

US 2010/0059803 A1 Mar. 11, 2010

(30) Foreign Application Priority Data

Sep. 5, 2008 (FR) ...................... 08 55974

(51) Int. Cl.
*H01L 31/062* (2012.01)
(52) U.S. Cl.
USPC ............ 257/292; 257/291; 257/293; 257/294
(58) Field of Classification Search
USPC ................................................ 257/291–294
See application file for complete search history.

(56) References Cited

U.S. PATENT DOCUMENTS

| | | | | |
|---|---|---|---|---|
| 4,316,205 A | * | 2/1982 | Aoki et al. ................ | 257/292 |
| 2006/0068586 A1 | * | 3/2006 | Pain .............................. | 438/643 |

| | | | |
|---|---|---|---|
| 2006/0086956 A1 | | 4/2006 | Furukawa |
| 2007/0001100 A1 | | 1/2007 | Hsu et al. |
| 2007/0052050 A1 | | 3/2007 | Dierickx |

FOREIGN PATENT DOCUMENTS

| | | |
|---|---|---|
| EP | 1 916 714 A1 | 4/2008 |
| EP | 2 009 696 A2 | 12/2008 |
| JP | 01-082666 A | 3/1989 |
| JP | 02-264473 A | 10/1990 |
| JP | 02-296368 A | 12/1990 |
| JP | 2006-261372 A | 9/2006 |
| JP | 2008-103668 A | 5/2008 |

OTHER PUBLICATIONS

French Search Report dated Apr. 17, 2009.

* cited by examiner

*Primary Examiner* — Samuel Gebremariam
(74) *Attorney, Agent, or Firm* — Pearne & Gordon LLP

(57) ABSTRACT

An image sensor comprising at least:
  CMOS-type photodiodes and transistors produced in a semiconductor layer having a thickness of between approximately 1 μm and 1.5 μm,
  a dielectric layer in which electrical interconnect layers are made, which are electrically connected to one another and/or to the CMOS photodiodes and/or transistors, said dielectric layer being arranged against a first face of the semiconductor layer opposite a second face of the semiconductor layer through which the light received by the sensor from the exterior is intended to enter,
  light-reflecting means arranged in the dielectric layer, opposite the photodiodes, and capable of reflecting at least a portion of the light received by the sensor towards the photodiodes.

12 Claims, 4 Drawing Sheets

LIGHT REFLECTING CMOS IMAGE SENSOR

TECHNICAL FIELD

The invention relates to the field of image sensors, or imagers, manufactured in CMOS technology and of the "backside" type, i.e., such that the light enters these sensors via the side opposite that where the interconnect layers are arranged.

The invention applies in particular to the manufacture of low-cost image sensors used, for example, in mobile phones or webcams, and more generally in any type of still or video camera making use of CMOS image sensors.

PRIOR ART

Two types of image sensors exist for electronically recording an image:
- CCD sensors, i.e., charge-transfer devices moving an electrical signal received from photodiodes to an amplifier and a digital converter,
- CMOS sensors, comprising amplifiers which, at the desired moment, stream the electrical signal delivered by each photodiode over electrical lines running to a digital converter.

Such a sensor, manufactured in CCD or CMOS technology, may be of the "backside" type, the captured light then entering via the face opposite that where the electrical interconnect layers of the sensor are located, or of the "front side" type, the captured light then passing through regions left free between the electrical interconnects in order to reach the semiconductor of the photodiodes.

"Backside" CMOS imagers are primarily produced in silicon technology, i.e., comprising CMOS photodiodes and transistors produced in a layer of silicon. In order to reduce the manufacturing costs thereof, it is sought to reduce the size of these imagers as much as possible, so as to produce the largest number of same on a semiconductor wafer. In addition, it is likewise sought to increase the resolution of the captured images by increasing the number of photodiodes in each imager, i.e., the number of pixels for each imager. In order to respond to these two constraints, it is therefore sought to reduce the pixel widths, or pitches, of these imagers.

However, other constraints must likewise be taken into account in the manufacture of these imagers. These constraints correspond to the physical constants of the semiconductor used to produce the CMOS photodiodes and transistors, such as light absorption or laws of motion of the charges generated in these materials. These constraints on the physical constants of the semiconductor material are mutually contradictory because, in order the maximise the absorption of photons by the photodiodes, it is necessary to maximise the thickness of the semiconductor layer used, and in order to maximise collection of the charges generated by the absorption of the photons by the photodiodes, it is necessary to minimise the thickness of this semiconductor layer. A compromise it therefore reached with respect to the thickness of the semiconductor layer, and consists in maintaining a semiconductor thickness greater than approximately 2 µm, e.g., equal to approximately 2.5 µm, in order to obtain proper functioning of the sensor.

Although it is technically possible to reduce the width or the pitch of the pixels to a dimension less than approximately 2 µm, the effects due to the thickness of the semiconductor used, such as the absorption of oblique-incidence photons or lateral scattering of the electrons generated, do not enable this reduction in the width of the pixels to be achieved without a modification of the actual structure of the pixel, considering the minimum thickness of 2 µm for the semiconductor layer.

DISCLOSURE OF THE INVENTION

Thus there is a need to propose an image sensor, as well as a method of producing such a sensor, the structure of which is compatible with a semiconductor layer of reduced thickness, while at the same time preserving the conventional structural pixel elements, and while having a good photodiode photon conversion efficiency.

To accomplish this, one embodiment of the invention proposes an image sensor comprising at least:
- CMOS-type photodiodes and transistors produced in a layer containing at least one semiconductor,
- a layer containing at least one dielectric in which electrical interconnect layers are made, which are electrically connected to one another and/or to the CMOS photodiodes and/or transistors, said dielectric layer being arranged against a first face of the semiconductor layer opposite a second face of the semiconductor layer through which the light received by the sensor from the exterior is intended to enter,
- light-reflecting means arranged in the dielectric layer, e.g., opposite the photodiodes, and capable of reflecting at least a portion of the light received by the sensor towards the photodiodes, or towards the semiconductor layer.

In comparison with an image sensor of the prior art, this sensor comprises a "front side" region, i.e., a region where the interconnect layers are arranged, which is modified by the presence of light-reflecting means. These light-reflecting means do not involve any modification of the "backside" region of the sensor. Thus, this structural modification does not exclude possible subsequent structural modifications.

Owing to the light-reflecting means arranged in the dielectric layer, photon absorption in the semiconductor layer is increased, as well as the photon conversion efficiency in this layer, thereby allowing a reduction in the thickness of the semiconductor layer without bringing the overall structure of the sensor into question, by modifying only the region of the electrical interconnects, and without modifying the existing overall structure of the electrical interconnect layers. The reduction in thickness of the semiconductor layer associated with the presence of light-reflecting means therefore makes it possible to minimise the electronic crosstalk, i.e., mixing of the signals between adjacent pixels in the image sensor, and increases the collection of the photon absorption-generated charges.

In view of the reduction in thickness of the semiconductor layer, it is therefore possible to reduce the width or the pitch of the pixels of this sensor, enabling a sensor to be obtained which comprises more pixels for a single occupied surface area, without the phenomena of oblique-incidence photon absorption or lateral diffusion of generated electrons disrupting the operation of the sensor.

In addition, the presence of these light-reflecting means does not prevent the presence of a dielectric in contact with the surface of the semiconductor layer, which limits the electron impact on the image sensor.

Irrespective of the reduction in the pixel widths of the sensor, the reduction in the thickness of the semiconductor layer makes it possible to better separate the pixel signals and to improve the MTF (modulation transfer function) of the sensor, in particular when it is desired to preserve a pixel width equal to at least approximately 2 µm. In addition, this reduction in the thickness of the semiconductor layer likewise makes it possible to improve the colour separation (coloured fringe effect) carried out by the colour filters of the sensor.

The surface of the photodiodes, which is situated opposite the light-reflecting means, in a plane passing through the first face of the semiconductor layer, may be equal to or greater than approximately 70% of the total surface area of the photodiodes in said plane passing through the first face of the semiconductor layer.

The light-reflecting means may comprise at least one of the electric interconnect layers having a reflective surface, i.e., a surface situated opposite the semiconductor layer, of between approximately 40% and 80%, or between approximately 50% and 90%, or else between approximately 30% and 90% of the surface of the first face of the semiconductor-based layer or of the surface opposite the semiconductor layer of another one of the electric interconnect layers.

In this way, the surface of at least one of the interconnect layers is increased, thereby enabling a surface to be formed for reflecting the photons which pass through the semiconductor layer without being transformed into electrical signals by the photodiodes, towards the semiconductor layer. One or more of the metal interconnect layers may have such a reflecting surface.

The distance between said reflective electrical interconnect layer and the first face of the semiconductor layer may be greater than or equal to approximately 200 nm, or greater than or equal to approximately 300 nm. Thus, this distance makes it possible to prevent electrical fields, which were created by the movement of electrical charges and which are prevalent in the electrical interconnect layers, from disrupting the operation of the photodiodes and transistors of the image sensor.

The light-reflecting means may comprise at least one metallic layer, the principal faces of which are substantially parallel to the first face of the semiconductor layer, the electrical interconnect layers being arranged between said metallic layer and the semiconductor layer.

The surface of one of these principal faces of the metallic layer may be substantially equal to the surface of the first face of the semiconductor layer. With this alternative, a homogeneous light reflection is obtained on the entirety of the sensor.

The metallic layer may have a thickness of between approximately 10 nm and 100 nm.

The light-reflecting means may comprise at least one layer containing at least one light-reflectable material, the principal faces of which are substantially parallel to the first face of the semiconductor layer, which is arranged between the interconnect layers and the semiconductor layer and through which electrical contacts pass which connect the electrical interconnect layers to the CMOS photodiodes and/or transistors.

This reflective layer, for example, may be made between gates of the CMOS transistors arranged in the dielectric layer, against the first face of the semiconductor layer.

The layer of light-reflectable material may contain aluminium and/or copper and/or chromium and/or amorphous silicon and/or polycrystalline silicon, and/or have a thickness of between approximately 10 nm and 100 nm.

The distance between the layer of light-reflectable material and the first face of the semiconductor layer may be between approximately 70 nm and 120 nm, this value being dependable, in particular, on the value of the central operating wavelength of the device.

The light-reflecting means may further comprise a second layer containing at least one dielectric material, or a void space, which is arranged between the layer of light-reflectable material and the first face of the semiconductor layer. This second dielectric layer, or this void space, makes it possible to improve the absorption of reflected photons in the semiconductor, while contributing to the reflection of these photons. When the light-reflectable material is not of a metallic nature, the dielectric material may be chosen such that the optical index thereof is lower than the optical index of the light-reflectable material.

A portion of the dielectric layer may be arranged between the second dielectric layer, or the void space, and the first face of the semiconductor layer, and have a thickness of between approximately 1 nm and 10 nm.

The thickness of the light-reflectable material, and/or the thickness of the dielectric layer or layers and/or the thickness of the void situated between the first face of the semiconductor layer and the layer of light-reflectable material may be equal to approximately:

$$\frac{\lambda c \times n}{4},$$

with
   $\lambda c$: the central wavelength of the range of operating wavelengths of the image sensor, and which passes through the semiconductor layer,
   n: the optical index of the material of said layer, or the real part of the optical index of the material of said layer.

The layer of light-reflectable material may be electrically connected to doped regions formed in the semiconductor layer. In this case, the light-reflecting layer may likewise form a polarising electrode which is electrically connected to the CMOS photodiodes and/or transistors.

The semiconductor layer may have a thickness of between approximately 1 μm and 2 μm, or preferably between approximately 1 μm and 1.5 μm.

Another embodiment of the invention likewise relates to a method of producing an image sensor, comprising at least the following steps of:
   producing doped regions of CMOS-type photodiodes and transistors in a layer containing at least one semiconductor,
   producing electrical interconnect layers which are electrically connected to one another and/or to the CMOS photodiodes and/or transistors in a layer containing at least one dielectric arranged against a first face of the semiconductor-based layer, which is opposite a second face of the semiconductor-based layer through which the light received by the sensor from the exterior is intended to enter,
   and further comprising the production of light-reflecting means arranged in the dielectric layer, e.g., opposite the photodiodes, and capable of reflecting at least a portion of the light received by the sensor, towards the semiconductor layer, or towards the photodiodes.

The thickness of the semiconductor layer may be between approximately 1 μm and 1.5 μm, this thickness being obtainable by a thinning out of the semiconductor layer.

BRIEF DESCRIPTION OF THE DRAWINGS

This invention will be better understood upon reading the description of exemplary embodiments, given for purely illustrative and non-limiting purposes, with reference to the appended drawings, in which.

Identical, similar or equivalent parts of the various figures described hereinbelow bear the same numerical references, so as to facilitate moving from one figure to another.

The various parts shown in the figures are not necessarily at a uniform scale, in order to render the figures more legible.

The various possibilities (alternatives and embodiments) should be understood as being non-mutually exclusive, and may be combined with one another.

DETAILED DISCLOSURE OF PARTICULAR EMBODIMENTS

Figure 1:
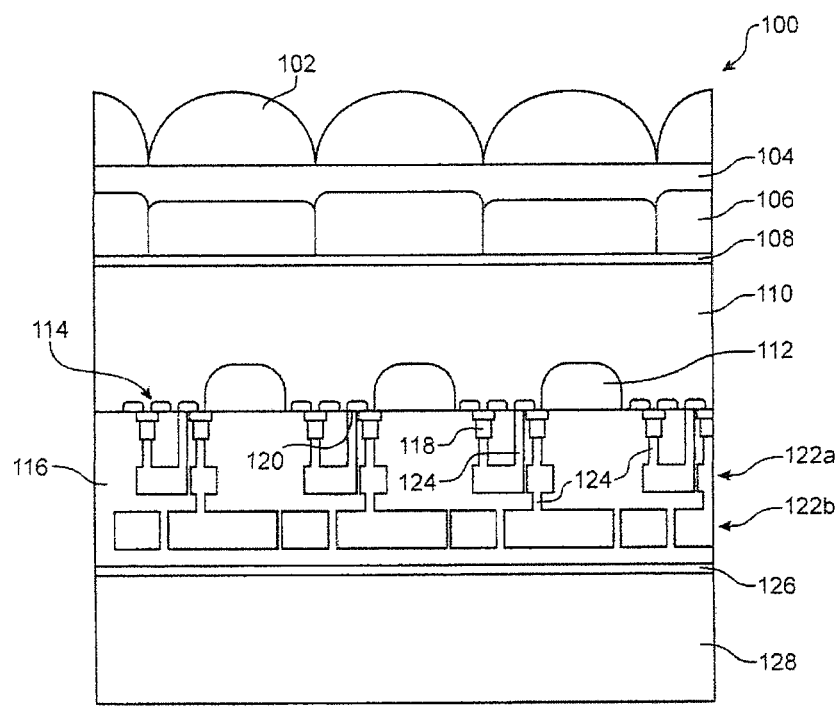
FIGS. 1 to 3 show image sensors according to a first, a second and a third embodiment, respectively.

Reference is first made to FIG. 1, which shows an image sensor 100 according to a first embodiment.

The image sensor 100 comprises a first "backside" region through which the light from the captured images enters. This region comprises micro-lenses 102, which are arranged on a planarisation layer 104 formed on colour filters 106. Each micro-lens 102 may have a width less than approximately 2 µm, e.g., between approximately 1 µm and 1.7 µm. The width of the micro-lens 102 corresponds to the width, or the pitch, of one pixel of the image sensor 100. These colour filters 106, for example, may be arranged according to a so-called "Bayer" structure, such a structure comprising a red filter, two green filters and a blue filter, which are arranged one next to the other in the form of a square matrix. The "backside" region likewise comprises a passivation layer 108, e.g., containing $SiO_xN_y$, such as $SiO_2$ and/or $Si_3N_4$, which is formed between the colour filters 106 and a semiconductor layer 110. This "backside" region has a thickness equal to the sum of the thicknesses of the micro-lenses 102, the planarisation layer 104, coloured filters 106 and passivation layer 108, that is to say, a total thickness of greater than approximately 1 µm or between approximately 1 µm and 3 µm.

The semiconductor layer 110, which is preferably silicon-based, but which may likewise contain any other semiconductor, forms a region for absorbing the light entering from the "backside" region and for separating the charges generated by the electrical fields in the semiconductor 110. This layer 110 has a thickness of between approximately 1 µm and 2 µm, e.g., equal to approximately 1.5 µm.

Photodiodes 112, as well as CMOS transistors 114 are produced in the silicon layer 110. The photodiodes 112 collect the charges created by the photons received from the "backside" region of the sensor 100, in order to convert same into electrical signals. These electrical signals are then used through the CMOS transistors 114 so as to be amplified and brought outside the matrix of photodiodes and transistors.

The image sensor 100 likewise comprises a "front side" region comprising a dielectric layer 116, e.g., containing $SiO_xN_y$, such as $SiO_2$ and/or $Si_3N_4$, wherein are produced the gates 118 of the CMOS transistors 114, electrical contacts 120 connected to the sources and drains of the CMOS transistors 114, as well as electrical interconnect layers 122. In FIG. 1, only two interconnect layers 122a and 122b are shown. However, the sensor 100 may comprise a larger number of interconnect layers, e.g., up to 15 interconnect layers, likewise called interconnect levels. Via holes 124, or plated through-holes, are likewise made in the dielectric layer 116 and electrically connect the contacts 120 and the gates 118 to the interconnect layers 122, as well as the various interconnect layers 122 to one another. These via holes 124 form vertical electrical contacts which interconnect these various elements.

Finally, the image sensor 100 comprises a bonding layer 126 connecting the dielectric layer 116 to a support plate or substrate 128.

In this first embodiment, the sensor 100 comprises a second interconnect layer 122b, which, opposite the semiconductor layer 110, has a larger surface area than an interconnect layer of a conventional CMOS image sensor. Such being the case, and given that the interconnect layers 122 are metal-based, e.g., aluminium and/or tungsten and/or copper, this surface makes it possible to achieve optical reflectivity of the photons which have passed through the semiconductor layer 110 but which have not been converted into electrical signals by the photodiodes 112, and to thereby send them back towards the semiconductor layer 110. In this way, the rate of absorption of the photons by the photodiodes 112 is improved, thereby making it possible to reduce the thickness of the silicon layer 110, and to therefore reduce the width of the pixels and to reduce or eliminate the electron crosstalk of the sensor 100, while at the same time improving the conversion efficiency of the sensor 100. In addition, portions of this second interconnect layer 122b are situated opposite the photodiodes 112, so as to send the photons back towards the photodiodes.

In one alternative of this first embodiment, it is possible that it is not the second interconnect level 122b which has optical reflectivity, but the first interconnect level 122a, or else both, and/or one or more other interconnect levels, if the sensor 100 comprises more than two electrical interconnect levels.

If it is desired to maximise optical reflectivity in the sensor, the interconnect level closest to the semiconductor layer 110 is preferably chosen, i.e., the first interconnect level 122a, in order to form the reflective layer. On the other hand, if it is desired to reflect light without complicating the production of the via hole passages 124 towards the semiconductor layer 110, the second interconnect layer 122b is preferably chosen (or at least one of the lower interconnect levels, if the sensor comprises more than two interconnect levels) in order to form the reflective layer.

In addition, the distance between the interconnect layer serving as a reflective layer and the silicon layer 110 is greater than approximately 300 nm, or greater than approximately 200 nm, so as to prevent disturbances in the operation of the photodiodes 112 and transistors 114, which are due to the presence of magnetic fields in the interconnect levels 122.

Although the dimensions of the interconnect layer 122b are chosen so as to maximise light reflection, in particular in order to maximise the reflecting surface in the direction of the photodiodes, the dimensions of this layer are likewise chosen so as to not short-circuit the interconnect layers 122a, 122b relative to one another, or the various portions of the interconnect layer 122b itself. Generally speaking, the ratio between the reflecting surface of the interconnect layer 122b, i.e., the surface of the face of this layer 122b situated opposite the semiconductor layer 110, and the surface of one of the principal faces of the semiconductor layer 110 or of the interconnect layer 122a, may, for example, be between 50% and 90%. In this way, it is possible to reflect between approximately 40% and 75%, or between 40% and 80% of the light having passed through the semiconductor layer 110, and the photons of which were not converted into electrical signals.

Figure 2:
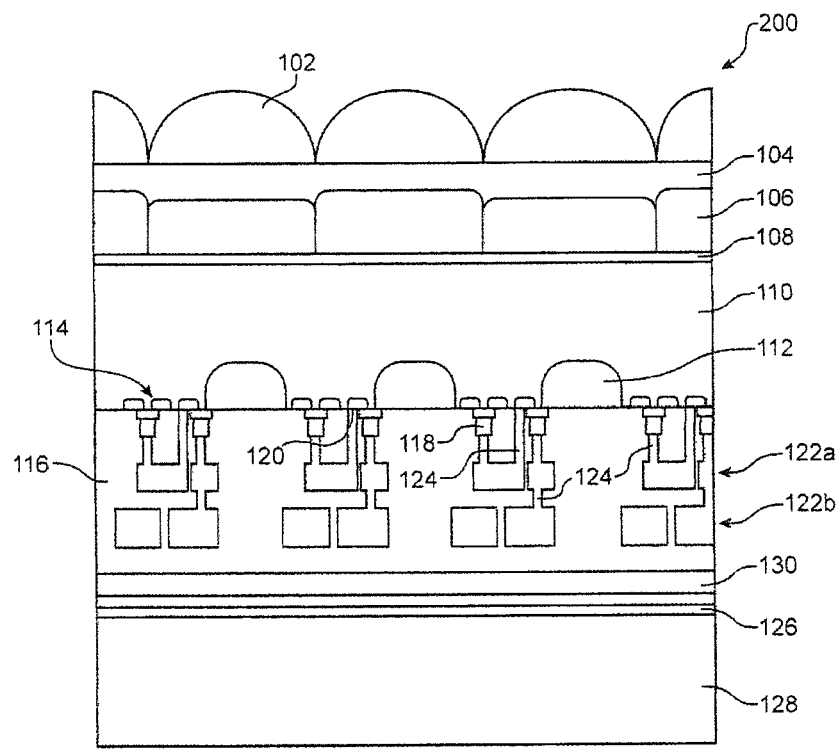

Reference is now made to FIG. 2, which shows an image sensor 200 according to a second embodiment.

In comparison with the image sensor 100 shown in FIG. 1, the image sensor 200 comprises two interconnect levels 122a, 122b having a surface, with respect to the semiconductor layer 110, which is similar to that introduced by the second interconnect layer 122b of the image sensor 100, i.e., not having a surface which is specially designed to achieve maximum reflection of the photons not converted into electrical signals towards the silicon layer 110. In this way, contrary to image sensor 100, it is not the second interconnect layer 122b which serves as a reflecting layer, but an additional layer 130 formed beneath the second interconnect layer 122b. This layer 130 is metal-based, e.g., similar to the metal of the interconnect layers 122, and is made over the entire surface of the dielectric layer 116, thereby having a reflecting surface corresponding to the entire surface area of one of the principle faces of the silicon layer 110 situated opposite this addition reflecting layer 130. The thickness of metal chosen to reflect the photons may be small: the metal layer 130 may have a thickness of between approximately 10 nm and 100 nm. This layer 130 makes it possible to reflect all of the photons which passed through the openings in layers 122a, 112b, between the interconnects of these layers 122a, 122b.

This additional layer 130, which is present over the entire surface of the semiconductor layer 110, makes it possible to obtain a homogeneous degree of optical reflectivity over the entire semiconductor layer 110, and without modifying the geometry of the interconnect layers 122a, 112b of the sensor 200.

Figure 3:
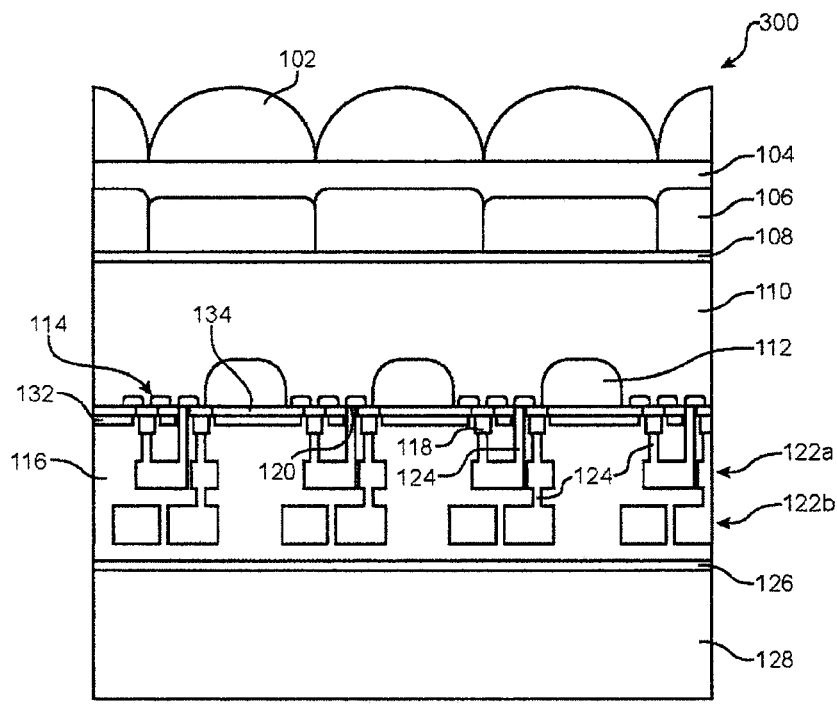

Reference is now made to FIG. 3, which shows an image sensor 300 according to a third embodiment.

Contrary to the image sensor 100 shown in FIG. 1, image sensor 300 comprises two interconnect levels 122a, 122b, which do not have a surface optimised for reflecting photons towards the silicon layer 110, in a way similar to sensor 200. Thus, contrary to image sensor 100, it is not the second interconnect level 122b which serves as a reflecting layer, but an additional layer 132 formed above the interconnect layers 122, in the dielectric layer 116.

This additional layer 132, for example, is metal-based, such as aluminium and/or copper and/or chromium and/or a semiconductor such as amorphous silicon and/or polycrystalline silicon, and/or any other material suitable for producing such light reflection. The thickness of same, for example, is between approximately 10 nm and 100 nm. In this third embodiment, the thickness of the additional layer 132 is equal to approximately 30 nm. In addition, when the additional layer 132 contains a semiconductor and/or any other material of a non-metallic nature, the material of the reflecting layer 132 may have an optical index greater than approximately 3, thereby forming a high optical index layer.

The reflecting layer 132 is not applied directly against the upper face of the dielectric layer 116. A portion of the dielectric layer 116 situated between the reflecting layer 132 and the upper face of the dielectric layer 116 forms a dielectric portion 134 having a thickness of between approximately 70 nm and 120 nm, and an optical index of between approximately 1.35 and 1.6, thereby forming a low optical index layer.

This additional layer 132 is not used to conduct electrical signals, but makes it possible to reflect photons having passed through the silicon layer 110 and which have not been absorbed and converted into electrical signals by the photodiodes 112. Thus, the reflecting layer 132 is not in electrical contact with the gates 118 and drain-source contacts 120, but passes through these gates 118 and these contacts 120, and comprises electrical insulating regions in the passages of the gates 118 and contacts 120 in layer 132. Furthermore, the additional layer 132 is formed such that a large portion (at least 70% of the total surface) or the entire surface of the photodiodes 112 is situated opposite the additional layer 132.

Figure 4:
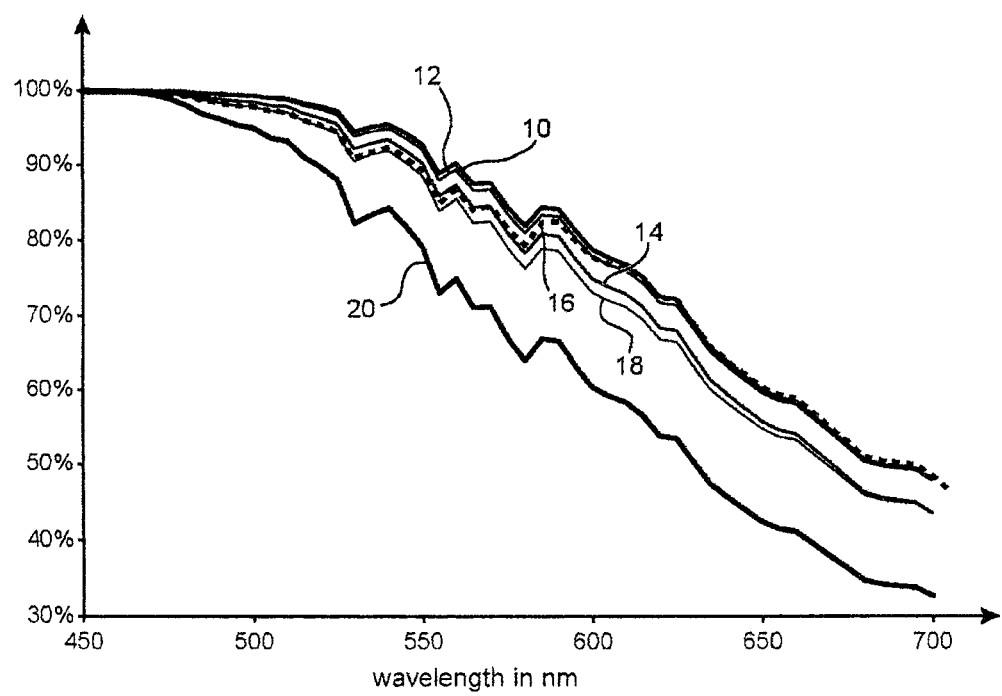
FIG. 4 shows simulations of photon absorption in the semiconductor layer of an image sensor according to the third embodiment, as a function of the wavelength of the light received and depending on the nature of the materials of the reflecting layer and of the dielectric layer used for light reflection.

FIG. 4 shows simulations of photon absorption in the semiconductor layer 110 of the image sensor 300, as a function of the wavelength of the captured light. The various curves are plotted for various materials of the reflecting layer 132 and dielectric layer 116. These simulations correspond to photon absorption in a silicon layer 110 of a thickness equal to approximately 1.5 µm, of which the thickness of the reflecting layer 132 is equal to approximately 30 nm and of which the thickness of the dielectric layer 134 is equal to approximately 90 nm.

Curve 10 shows this absorption for an aluminium-based reflecting layer 132 and an $SiO_2$-based dielectric layer 116. It is seen that the absorption is substantially similar to that obtained in the "backside" CMOS-type image sensor of the prior art comprising a silicon layer of a thickness equal to approximately 2.5 µm but no reflecting layer (shown by curve 12).

Curves 14, 16, 18 show the performance levels obtained in the cases of an absorption layer 132 containing amorphous or polycrystalline silicon, copper and chromium, respectively, and an $SiO_2$-based dielectric layer 116. In these cases, it is observed that the absorption is slightly less than that achieved with an aluminium-based reflecting layer 132 and an $SiO_2$-based dielectric layer 116.

Curve 20 shows photon absorption in a silicon layer of a thickness equal to approximately 1.5 µm in a "backside" CMOS-type image sensor of the prior art, i.e., not comprising any light-reflecting means. By comparing these various curves, it is observed that the absorption in the thin, crosstalk-free layer having a thickness equal to approximately 1.5 µm is greater than that achieved in a single device, but which does not comprise any reflecting layer.

Figure 5:
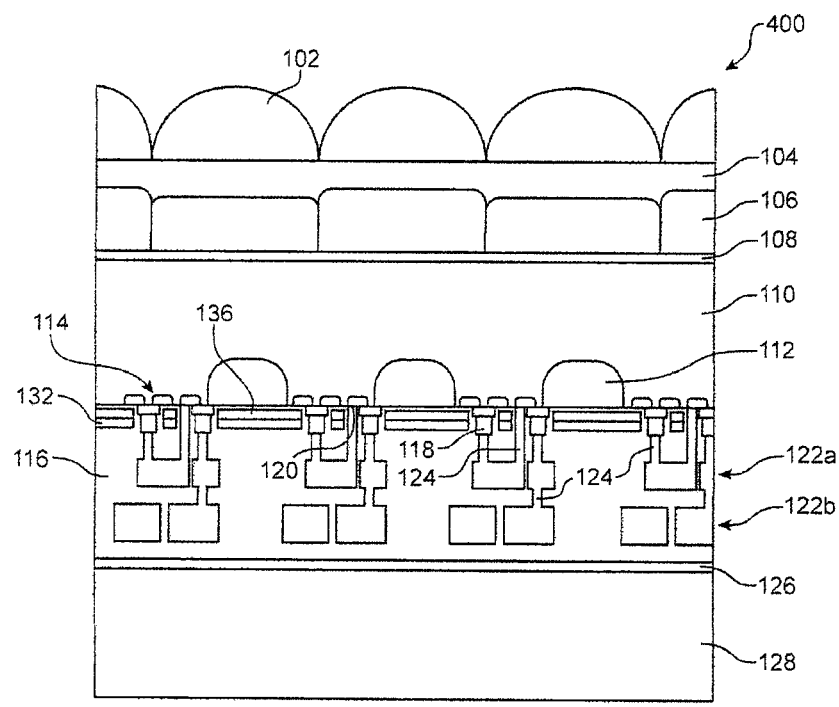
FIGS. 5 and 6 show image sensors according to fourth and fifth embodiments, respectively.

Reference is now made to FIG. 5, which shows an image sensor 400 according to a fourth embodiment.

In addition to the reflecting layer 132 present in the sensor 300 of FIG. 3, sensor 400 further comprises a dielectric layer 136 having an optical index lower than that of the material of the reflecting layer 132. This configuration is particularly advantageous when this dielectric material is different from the dielectric material of layer 116. A portion of the dielectric layer 116 having a thickness of between approximately 1 nm and 10 nm is likewise arranged above the dielectric layer 136. This dielectric layer 136 makes it possible to improve the absorption and reflection of the photons in the semiconductor layer 110.

In an alternative of this fourth embodiment, the dielectric layer 136 may be replaced by a void space. This void space fulfils the same purpose as the dielectric layer 136.

Figure 7:
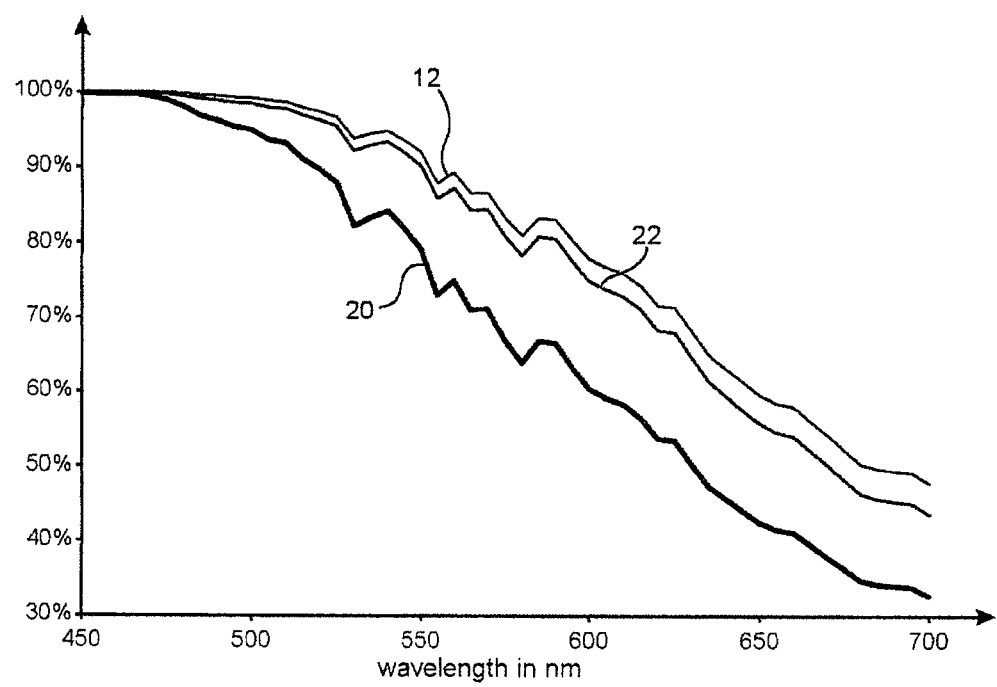
FIG. 7 shows simulations of photon absorption in the semiconductor layer of an image sensor according to the fourth embodiment, as a function of the wavelength of the light received and depending on the nature of the materials of the reflecting layer and of the dielectric layer used for light reflection.

In another alternative, it would be possible for the reflecting layer to be dielectric-based. For example, the reflecting layer may be $TiO_2$-based, the dielectric layer 136, in this case, containing a porous material, e.g., an oxide of the $Si_xO_yN_z$ type. Curve 22 in FIG. 7 shows photon absorption in a silicon layer having a thickness equal to approximately 1.5 µm in an image sensor comprising a $TiO_2$-based reflecting layer and a dielectric layer 136 containing a porous material. By comparing this curve to curves 12 and 20, which show photon absorption in a silicon layer having a thickness equal to approximately 2.5 µm and 1.5 µm, respectively, in a "backside" CMOS-type image sensor of the prior art, it is observed that the values of this curve 22 are close to the values of curve 12.

In another alternative, it would be possible to replace the reflecting layer 132 and the dielectric layer 136 with a stack of layers formed by alternating layers of high and low optical indices.

The thickness of the reflecting layer 132 and/or the dielectric layer 136 and/or the portion of the dielectric layer 116 situated between the dielectric layer 136 and the semiconductor layer 110, is preferably chosen to be equal to approximately $$\frac{\lambda c \times n}{4},$$

with λc: the central wavelength of the operating range of image sensor, and which passes through the semiconductor layer 110, and n the real part of the optical index of the material of the reflecting layer 132. For a sensor operating in the range of visible wavelengths, this central length may be equal to approximately 570 nm. This optimum thickness is referred to as the central wavelength resonance thickness.

Figure 6:
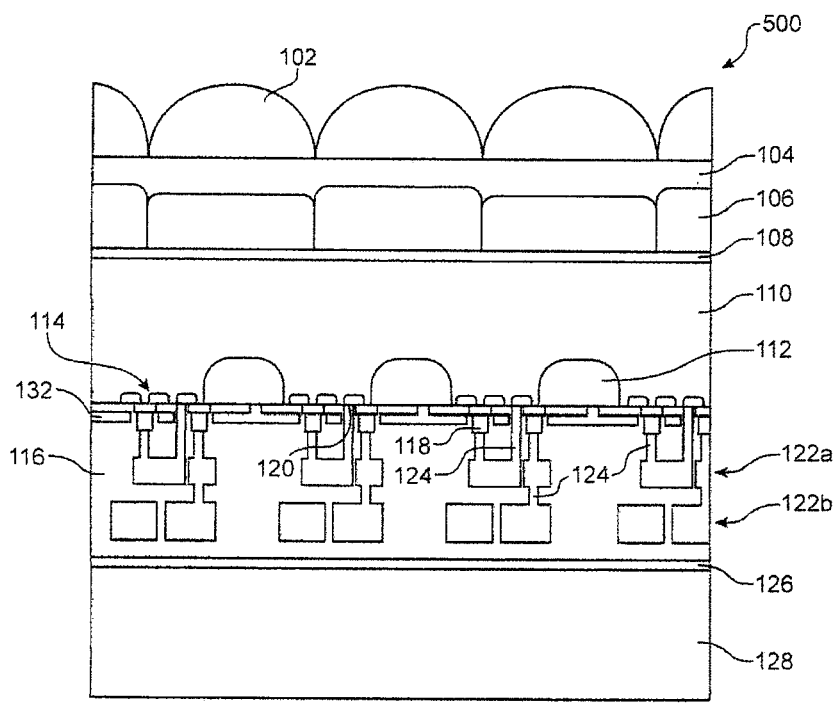

Reference is made to FIG. 6, which shows an image sensor 500 according to a fifth embodiment.

In comparison with image sensor 300, the reflecting layer 132, in addition to optically reflecting the photons in the semiconductor layer 110, likewise forms a polarising electrode of the photodiodes 112, without, however, delivering any current or transferring any signal from the photodiodes 112. The polarising role is carried out by contacting the doped regions of the semiconductor layer 110 forming the photodiodes 112. The thickness of the reflecting layer 132, which contains a metal of a different nature from the metals forming the other interconnect layers 122, is, for example, equal to approximately 30 nm.

These image sensors may be manufactured in conventional CMOS technology. To do so, starting with the semiconductor layer 110, dopants are first diffused into this layer 110 in order to form the active regions of the CMOS photodiodes 112 and transistors 114. The interconnect layers, as well as the light-reflecting means (formed by one or more of the interconnect layers and/or additional layers as described previously) are then produced via photolithography and etching steps, the metallic materials being capable of being deposited via growth or deposition steps. The dielectric material 116 is deposited gradually in-between the production of the various layers, so as to cover the interconnect and/or light-reflecting layers.

This assembly is then transferred onto the substrate 128 by means of the bonding layer 126. The face of the semiconductor layer 110 opposite that in contact with the dielectric 116 is then thinned out. Finally, the elements of the "backside" region, i.e., the passivation layer 108, the colour filters 106, the planarisation layer 104 and the micro-lenses 102 are produced on the previously thinned-out face of the semiconductor layer 110.

The invention claimed is:

1. An image sensor comprising at least:
   CMOS-type transistors,
   CMOS-type photodiodes formed in a semiconductor layer having a thickness of between approximately 1 μm and 1.5 μm,
   a dielectric layer in which electrical interconnect layers are made, which are electrically connected to one another and/or to the CMOS photodiodes and/or transistors, said dielectric layer being arranged against a first face of the semiconductor layer opposite a second face of the semiconductor layer through which the light received by the sensor from the exterior is intended to enter,
   light-reflecting means arranged in the dielectric layer, opposite the photodiodes, and capable of reflecting at least a portion of the light received by the sensor towards the photodiodes, wherein the light-reflecting means comprise at least one layer containing at least one light-reflecting material, the principal faces of which are substantially parallel to the first face of the semiconductor layer, which is arranged between the interconnect layers and the semiconductor layer and through which electrical contacts pass, which connect the electrical interconnect layers to the CMOS photodiodes and/or transistors, and wherein the distance between the layer of light-reflecting material and the first face of the semiconductor layer is between approximately 70 nm and 120 nm.

2. The image sensor according to claim 1, wherein the surface of the photodiodes, which is situated opposite the light-reflecting means, in a plane passing through the first face of the semiconductor layer, is equal to or greater than approximately 70% of the total surface area of the photodiodes in said plane passing through the first face of the semiconductor layer.

3. The image sensor according to claim 1, wherein the light-reflecting means comprise at least one of the electric interconnect layers having a reflective surface of between 50% and 90% of the surface of the first face of the semiconductor-based layer or of the surface opposite the semiconductor layer of another one of the electric interconnect layers.

4. The image sensor according to claim 3, wherein the distance between said reflective electrical interconnect layer and the first face of the semiconductor layer is greater than or equal to approximately 200 nm.

5. The image sensor according to claim 1, wherein the light-reflecting means comprise at least one layer containing at least one metallic layer, the principal faces of which are substantially parallel to the first face of the semiconductor layer, the electric interconnect layers being arranged between said metallic layer and the semiconductor layer.

6. The image sensor according to claim 5, wherein the surface of one of the principal faces of the metallic layer is substantially equal to the surface of the first face of the semiconductor layer.

7. The image sensor according to claim 5, wherein the thickness of the metallic layer is between approximately 10 nm and 100 nm.

8. The image sensor according to claim 1, wherein the layer of light-reflecting material contains aluminium and/or copper and/or chromium and/or amorphous silicon and/or polycrystalline silicon, and/or has a thickness of between approximately 10 nm and 100 nm.

9. The image sensor according to claim 1, wherein the light-reflecting means further comprise a second layer containing at least one dielectric material, or a void space, which is arranged between the layer of light-reflecting material and the first face of the semiconductor layer.

10. The image sensor according to claim 9, wherein a portion of the dielectric layer is arranged between the second dielectric layer, or the void space, and the first face of the semiconductor layer, and has a thickness of between approximately 1 nm and 10 nm.

11. The image sensor according to claim 1, wherein the thickness of the layer of light-reflecting material, and/or the thickness of the dielectric layer or layers and/or the thickness of the void situated between the first face of the semiconductor layer and the layer of light-reflecting material is equal to approximately:

$$\frac{\lambda c \times n}{4},$$

with
- λc: the central wavelength of the range of operating wavelengths of the image sensor, and which passes through the semiconductor layer,
- n: the real part of the optical index of the material of said layer.

12. The image sensor according to claim 1, wherein the layer of light-reflecting material is electrically connected to the doped regions formed in the semiconductor layer.

\* \* \* \* \*